(12) United States Patent
Simion et al.

(10) Patent No.: US 6,185,081 B1
(45) Date of Patent: Feb. 6, 2001

(54) BIAS LAYERS WHICH ARE FORMED ON UNDERLAYERS PROMOTING IN-PLANE ALIGNMENT OF THE C-AXIS OF COBALT USED IN MAGNETORESISTIVE TRANSDUCERS

(75) Inventors: Bogdan M. Simion, Pleasanton; Yingjian Chen, Fremont; Mark S. Miller, Danville, all of CA (US)

(73) Assignee: Read-Rite Corporation, Milpitas, CA (US)

( * ) Notice: Under 35 U.S.C. 154(b), the term of this patent shall be extended for 0 days.

(21) Appl. No.: 09/345,552

(22) Filed: Jun. 30, 1999

(51) Int. Cl.[7] ........................................ G11B 5/39
(52) U.S. Cl. ................................................ 360/327.3
(58) Field of Search ................................. 360/325, 327, 360/327.1, 327.3

(56) References Cited

U.S. PATENT DOCUMENTS

| | | | |
|---|---|---|---|
| 5,434,826 | 7/1995 | Ravipati et al. | 367/140 |
| 5,583,727 * | 12/1996 | Parkin | 360/113 |
| 5,693,426 | 12/1997 | Lee et al. | 428/611 |
| 5,789,056 | 8/1998 | Bian et al. | 428/65.3 |
| 5,800,931 | 9/1998 | Lee et al. | 428/611 |
| 5,846,648 | 12/1998 | Chen et al. | 428/332 |
| 5,858,566 | 1/1999 | Zhang | 428/694 |

* cited by examiner

*Primary Examiner*—A. J. Heinz
(74) *Attorney, Agent, or Firm*—Mark Lauer

(57) ABSTRACT

Bias layers for a magnetoresistive (MR) sensor have an in-plane easy axis of magnetization for providing a longitudinal bias to MR layers. The bias layers include cobalt (Co), and are formed on various underlayers having crystalline structures that encourage an in-plane alignment of the C-axis of that Co. Preferred underlayers include nickel aluminum (NiAl) and magnesium oxide (MgO), and an interlayer containing chromium (Cr) may be interposed between a bias layer and an underlayer.

26 Claims, 3 Drawing Sheets

BIAS LAYERS WHICH ARE FORMED ON UNDERLAYERS PROMOTING IN-PLANE ALIGNMENT OF THE C-AXIS OF COBALT USED IN MAGNETORESISTIVE TRANSDUCERS

TECHNICAL FIELD

The present invention relates to transducers that employ magnetoresistive sensing mechanisms.

BACKGROUND OF THE INVENTION

The use of magnetoresistive (MR) sensing mechanisms is well known. Such sensors can be used in information storage systems such as disk or tape drives, or as measurement devices for test equipment, among other things.

A transducer for reading and writing information on a medium such as a disk or tape, for example, may have a MR mechanism for sensing magnetic signals from the medium, as well as an inductive mechanism for writing magnetic signals to the medium. MR sensors or transducers that are known for disk drive heads include anisotropic magnetoresistive (AMR) sensors, canted current sensors, spin valve (SV) sensors, giant magnetoresistive (GMR) sensors, etc. To optimize sensor performance it is conventional to provide magnetic fields that bias the magnetoresistive layer or layers within the sensor, in order to remove noise that can occur due to boundary domains as well as to provide more easily interpreted signals.

Ravipati et al., in U.S. Pat. No. 5,434,826, discuss various mechanisms for providing a longitudinal bias to a MR sensor. As pointed out in that patent, it is important that the MR sensing layer has a magnetic direction that will change at a lower coercive force than that required to change the magnetic direction of the bias layers. Unfortunately, if the magnetization provided by the bias layers to the MR sensing layer is too strong, the sensing layer will not change magnetic direction under the influence of changing fields from the media. Even for the case where the MR sensing layer is able to change magnetic direction under the influence of media fields, the sensitivity of the sensing layer may be reduced by the longitudinal bias provided by the bias layers.

Moreover, bias layers abutting ends of MR sensor layers are constrained to a thickness approximating that of the sensor layers, which may be less than 1000 Å. Stated differently, a primary determinant of sensor linear resolution is the spacing between shield layers surrounding the sensor, within which bias, lead, gap and any seed layers must also fit. Unfortunately, the quest for higher sensor resolution and reduced thickness may exacerbate these difficulties.

This need for thinner sensor layers differs from the thickness requirements for media layers, for which a primary determinant of resolution is head to media spacing. Thus reducing the thickness of any overcoat that separates a media layer from the head may be important whereas the thickness of layers formed under the media layer may be immaterial, except for the extra time needed to create thicker underlayers. For example, in U.S. Pat. Nos. 5,693,426 and 5,800,931, Lee et al. teach that media coercivity may be enhanced by forming a relatively thick NiAl underlayer, but that such coercivity is dramatically reduced when the NiAl underlayers are less than 100 nm in thickness.

SUMMARY OF THE INVENTION

The present invention provides improved bias layers for MR sensors. The bias layers formed according to the present invention have an in-plane easy axis of magnetization that can used to provide a desired longitudinal bias. The bias layers may also have increased coercivity, which can help to maintain the magnetization of the bias layers in the presence of applied fields from the head or media.

Further, such bias layers may have a fine grain structure, which can be used to provide a magnetic field at a border between a bias layer and an MR sense layer that rapidly diminishes in strength with distance from that border. This border localized bias field can essentially pin border domains of the MR sense layer while leaving the remainder of the MR sense layer free to rotate under the influence of media fields, reducing noise in the sensor while increasing sensitivity to media fields.

Increases in coercivity and in-plane orientation of the easy axis of magnetization allow the bias layers to be made thinner, allowing other sensor layers to be thinner and sensor resolution to be increased. The increased coercivity and preferred in-plane crystalline orientation also increase the stability of the bias layers. An increase in a ratio of in-plane versus out-of-plane crystalline orientation of the bias layers also corresponds with decreased noise for the sensor.

DETAILED DESCRIPTION OF THE INVENTION

Figure 1:
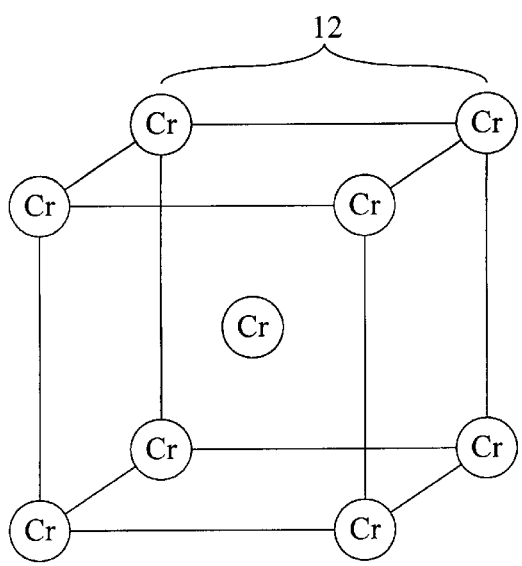
FIG. 1 is an illustration of a unit cell of crystalline chromium (Cr).

FIG. 1 illustrates a unit cell of chromium (Cr), which has a body centered cubic (BCC) crystalline structure. The Cr cell has a lattice parameter 12 of approximately 2.884 Å, which may be measured for example by X-ray diffraction.

Figure 2:
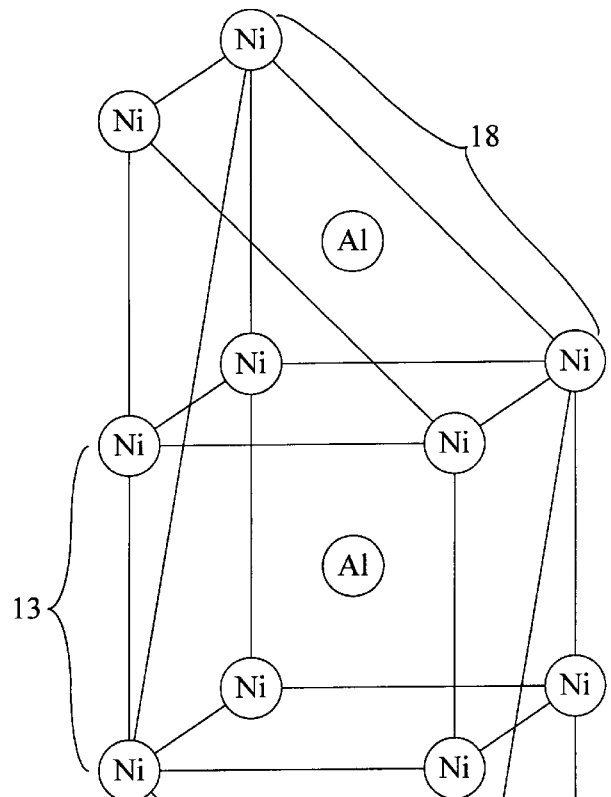
FIG. 2 is an illustration of a few unit cells of crystalline nickel-aluminum (NiAl).

As shown in FIG. 2, the unit cell of ordered nickel-aluminum (NiAl) is simple cubic, with Al occupying the center of cells having Ni at the corners (and Ni occupying the center of cells having Al at the corners), forming a B2 ordered crystalline structure. The NiAl cell has a lattice parameter 13 of approximately 2.89 Å, which is a close match to that of Cr.

Figure 3:
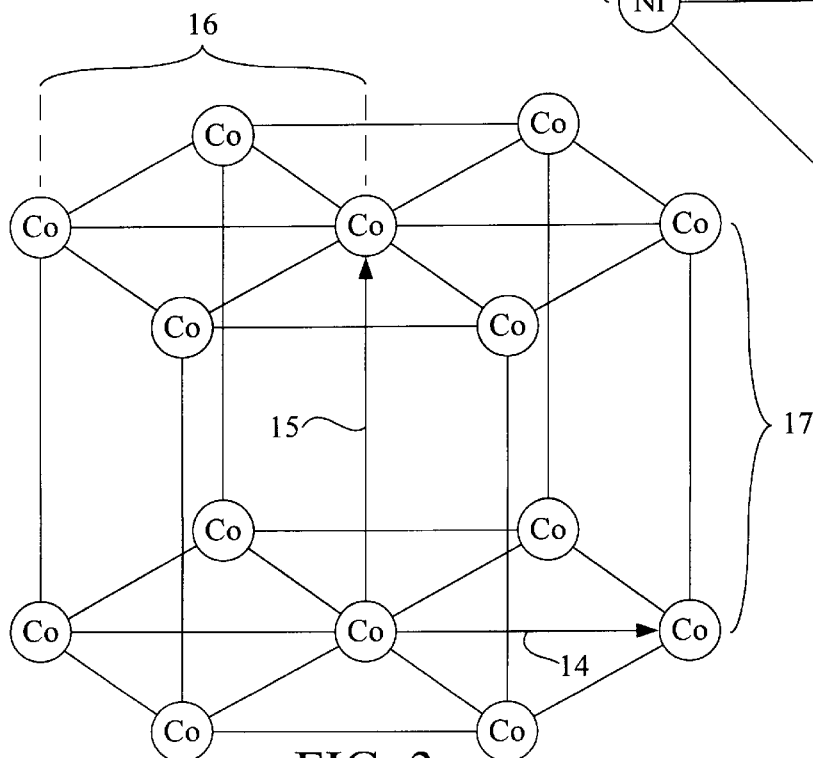
FIG. 3 is an illustration of a unit cell of crystalline cobalt (Co).

FIG. 3 depicts exterior atoms of a hexagonal close packed (HCP) unit cell of cobalt (Co), which is a primary constituent of a magnetic bias layer of the present invention. The Co unit cell has an A-axis 14 and a C-axis 15. The A-axis 14 corresponds to a lattice parameter 16 of 2.51 Å, which is close to the 2.89 Å lattice parameter 12 of Cr. On the other hand, the C-axis 15 of Co corresponds to a lattice parameter 17 of about 4.08 Å. Perhaps for this reason, a layer of Co crystals epitaxially grown on a surface of Cr tends to have the A-axis 14 aligned with the surface and the C-axis 15 oriented perpendicular to the surface. The C-axis 15 of Co coincides with an easy axis of magnetization for that material, and so the easy axis of magnetization for a Co layer formed on Cr is typically perpendicular to a plane with which the layer is aligned. Cobalt-based bias layers for MR sensors are conventionally formed on a Cr seed layer, with C-axes directed substantially perpendicular to the Cr seed layer and an easy axis of magnetization directed substantially out of plane.

Referring again to FIG. 2, NiAl may have a (112) peak that is observed via X-ray diffraction. The texture [112] indicates the presence at (112) planes in the seed of the surface plane. Within such planes, a distance 18 exists between lattice points that is about 4.07 Å, close to the 4.08 Å lattice parameter 17 of the C-axis 15 of Co. It is believed that this lattice matching encourages a Co layer grown on a NiAl seed to have more C-axes that are not perpendicular to the layer. Forming an increased concentration of Co crystals with C-axes that are not perpendicular to the layer increases the in-plane easy axis of magnetization for that layer.

Figure 4:
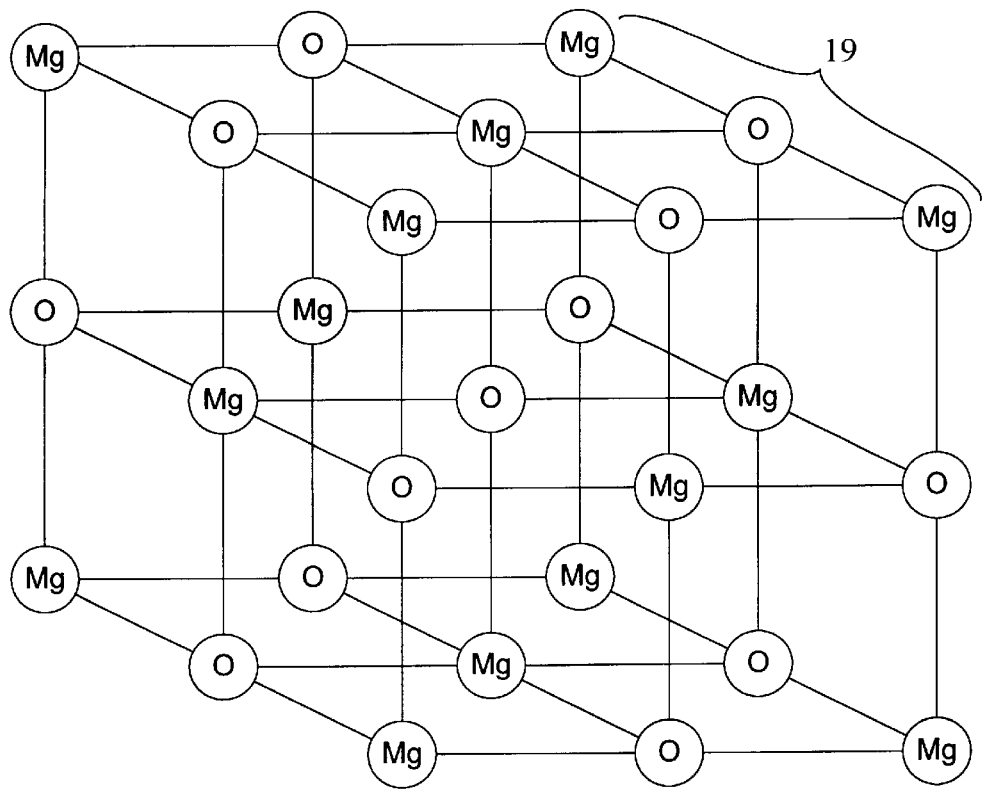
FIG. 4 is an illustration of a unit cell of crystalline magnesium oxide (MgO).

FIG. 4 illustrates the crystalline structure of magnesium oxide (MgO), which has a B1 crystallographic structure. MgO has a (002) peak corresponding to a distance 19 of 4.21 Å between lattice planes. As this distance 19 is an approximate match for the lattice parameter 17 corresponding to the Co C-axis 15, a Co-based bias layer grown atop a MgO seed layer has a tendency to have an in-plane easy axis of magnetization. With the bias layer having an increased in-plane easy axis of magnetization, that layer can be made thinner and still achieve the needed biasing of the sensor layers. Iron aluminum (FeAl) and cobalt titanium (CoTi) can also form favorable seed layers for cobalt-based bias layers of MR sensors.

Conventional bias layers have been measured to have an easy axis of magnetization that is directed about 70° from the plane with which the layers are generally aligned, this magnetization being termed substantially out-of-plane. Bias layers of the present invention, in contrast, may have an easy axis directed about 45° from the plane with which the layers are generally aligned, this magnetization being termed substantially in-plane. Diffraction measurements also detect an approximately 1/3 ratio of in-plane to out-of-plane crystallographic orientations of conventional bias films, versus a nearly 1/1 ratio of in-plane to out-of-plane crystallographic orientations for bias films of the present invention. Substantially greater sensor noise has been observed with conventional bias films as compared with the bias films of the present invention, which may be related to the reduction in out-of-plane magnetization.

Having greater in-plane orientation of bias layer easy axes allows the bias layers to be made thinner. Thinner bias layers allow a reduced shield to shield spacing and greater resolution, or thicker read gap layers and better sensor isolation, or both. For example, conventional bias layers may have a minimum thickness of a few hundred angstroms, whereas bias layers of the present invention may be as thin as 150 Å. Smaller grain sizes found in these bias layers can also provide more localized pinning of the sensor layers, reducing Barkhausen noise in sensor border domains while increasing overall sensitivity.

Figure 5:
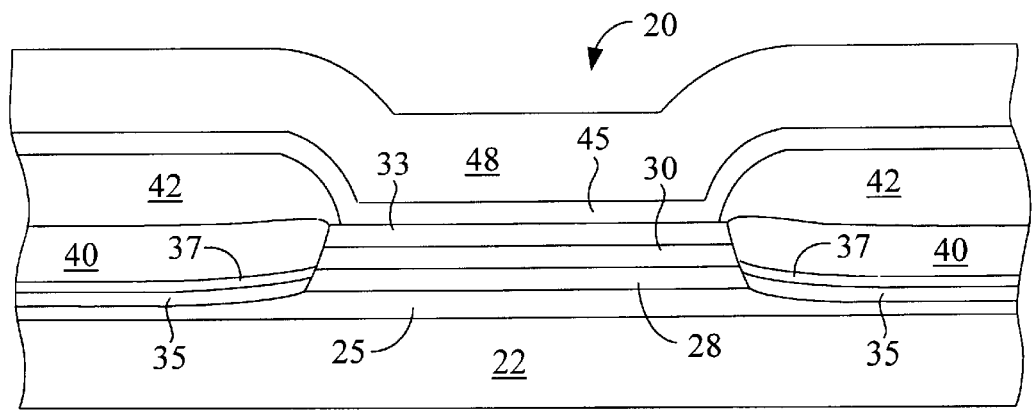
FIG. 5 is a media-facing view of a first embodiment of a transducer of the present invention having improved magnetic bias layers.

FIG. 5 shows a magnetoresistive (MR) transducer 20 that has been formed according to the present invention. The transducer 20 includes a first magnetically permeable layer 22 that is designed to shield sensor layers from stray magnetic fields. The magnetically permeable shield layer 22 may be formed of permalloy (NiFe) or other magnetically permeable materials such as CoZn, CoTa or FeAlN based materials for the situation in which the shield 22 may be heated to elevated temperatures during subsequent processing. The shield layer 22 may be formed on a substrate, not shown in this figure, which may be diced after the formation of multiple transducers to form individual heads such as sliders for disk drives.

A first read gap layer 25 of electrically insulating, nonmagnetic, impervious material is formed atop the shield layer 22. The read gap layer 25 is this embodiment is preferably formed of alumina ($Al_2O_3$). Atop the read gap 25 is a soft adjacent layer (SAL) 28 made of a low-coercivity, high-permeability magnetic material such as permalloy. A spacer layer 30 of tantalum (Ta) for instance separates the SAL 28 from a magnetoresistive sense layer 33 and provides a seed layer for the sense layer 33. The sensor layers 28, 30 and 33 have been masked and trimmed by ion milling or other processes, leaving sensor ends which may include a number of magnetic domains.

A seed layer 35 containing a material such as NiAl having a surface providing a lattice plane essentially matching a crystalline plane of cobalt that is parallel to the cobalt C-axis is formed on the exposed portion of the read gap layer 25. The seed layer 35 may have a thickness in a range between about 40 Å and 500 Å, depending upon other factors such as the shield-to-shield spacing of the sensor 50 and the thickness of the later formed bias layer. An optional interlayer 37 of Cr or an alloy containing Cr such as CoCrTa or CrV is formed on the seed layer. The Cr-based interlayer 37 should be thick enough to promote preferred interfacial growth of subsequently deposited Co-based film, yet thin enough to maintain the crystallographic orientation as well as the fine grain structure of the seed layer 35. A magnetic bias layer 40 is formed on the interlayer 37 to provide a bias to the sensor layers 28 and 33, in order to avoid undesirable edge effects in those layers that may otherwise cause Barkhausen noise. The magnetic bias layer 40 has a thickness greater than that of the seed layer 35, and may range between about 200 Å and 700 Å. The bias layer 40 may be formed of Co or an alloy containing Co such as CoCrPtTa. As a specific example, a 300 Å-thick magnetic bias layer of CoCrPt formed atop a 400 Å layer of NiAl topped with a 50 Å-thick interlayer layer of Cr was found to have an in-plane coercivity of about 1083 Oe, and an out of plane coercivity of about 210 Oe.

Atop the magnetic bias layer 40 a conductive lead layer 42 has been formed. Lead layer 42 may actually be formed in plural layers, such as a layer of Cr followed by a thicker layer of gold topped off with a thinner layer of Cr for a total layer 40 thickness of perhaps 500 Å. Another electrically insulating, amagnetic read gap layer 45 is then formed, followed by a second magnetically permeable shield layer 48. Above or below the sensor 20 (after or prior to forming the sensor) an optional inductive transducer may be formed.

Figure 6:
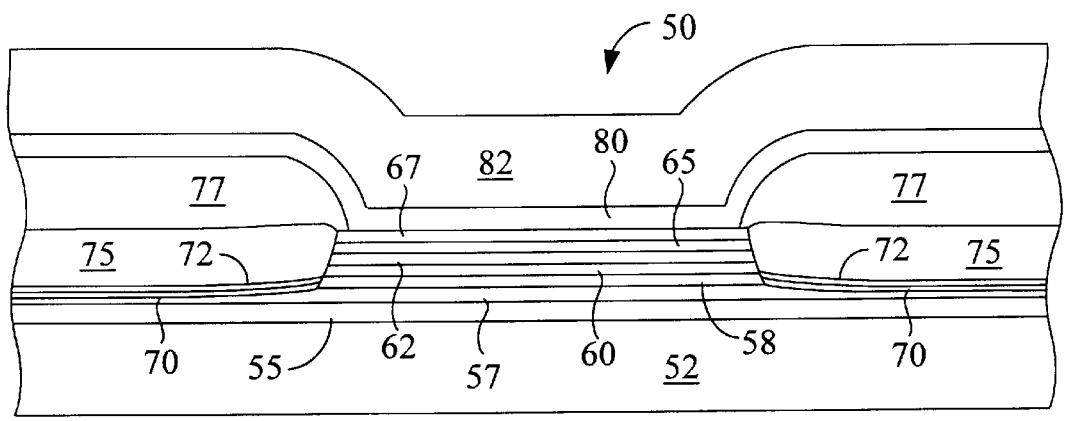
FIG. 6 is a media-facing view of a second embodiment of a transducer of the present invention having improved magnetic bias layers.

In FIG. 6 a spin valve sensor 50 of the present invention is shown in which a hard bias layer is formed atop a MgO seed layer. Much as before, the transducer 50 includes a first magnetically permeable layer 52 that is designed to shield sensor layers from stray magnetic fields. The magnetically permeable shield layer 52 may be formed of permalloy or other magnetically permeable materials such as CoZn, CoTa or FeAlN based materials for the situation in which the shield 52 may be heated to elevated temperatures during subsequent processing. As before, the shield layer 52 may be formed on a substrate, not shown in this figure, which may be diced after the formation of multiple transducers to form individual sensors or heads for disk or tape drives. Note that for some sensors a shield may not be employed, giving the sensor the ability to detect magnetic fields from a broader angular range.

A first read gap layer 55 of electrically insulating, nonmagnetic material is formed atop the shield layer 52. The first read gap layer 55 in this embodiment is preferably formed of alumina $Al_2O_3$, and may have a thickness of 200 Å to 500 Å, for example. On top of the first read gap layer 55 a first seed layer 57 of MgO is formed to a thickness of 80 Å to 200 Å. The MgO seed may be formed as described below in a manner promoting a smooth surface for growth of subsequent layers. A MR sense layer 58 composed of permalloy or other magnetically permeable material is formed on the seed layer 57. An electrically conductive spacer layer 60 of Cu, Au, Ti or other materials separates the sense layer 58 from a pinned layer 62 of Permalloy or other magnetic material. A pinning layer 65 adjoins and pins the pinned layer 62. The pinning layer 65 may for instance be composed of antiferromagnetic material that pins the magnetization of the pinned layer via surface interaction or other known pinning mechanisms may be employed. Another ferromagnetic layer 67 adjoins the antiferromagnetic layer 65 and is magnetostatically coupled with the pinned layer 62, enhances the pinning of that layer 62. The sense layer 58, spacer layer 60 and pinned layer 62 together form a spin valve sensor. Although not shown in this figure for conciseness, repetition of those layers can form a GMR sensor. Layers 58, 60, 62, 65 and 67 are masked over an active region and trimmed by ion milling or other processes, so that sensor ends remain which may include a number of magnetic domains.

The ion milling is exactingly timed to form ends for the sense layer 58 as shown in FIG. 6 without exposing the alumina read gap layer 55, leaving the MgO seed layer 57 exposed outside the sensor ends. The exposed portion of the MgO seed layer 57 may have a thickness in a range between about 10 Å and 80 Å, and preferably around 30 Å to soA. A layer 70 NiAl is formed on the exposed portion of the of seed layer 57, the NiAl layer preferably having a thickness in a range between about 80 Å and 200 Å. An interlayer 72 containing a material such as Cr or a Cr based alloy such as CrV or CoCrTa is then formed on the NiAl layer. Depending upon the application, layer 70 and/or layer 72 may be omitted. A magnetic bias layer 75 is formed to provide a bias to the sensor layers 58 and 62, in order to avoid undesirable edge effects in those layers that may otherwise cause Barkhausen noise. The magnetic bias layer 75 has a thickness that may range between about 100 Å and 800 Å, generally greater than that of the seed layer 70. Atop the magnetic bias layer 75 a conductive lead layer 77 has been formed. Another electrically insulating, nonmagnetic read gap layer 80 is then formed, followed by a another magnetically permeable shield layer 82. Above or below the sensor 20 (after or prior to forming the sensor) an optional inductive transducer may be formed.

The interlayer 72 in this embodiment may have a thickness in a range between about 10 Å and 50 Å, thin enough that the crystalline structure of the MgO seed layer 57 and/or NiAl seed layer 70 substantially transcends the interlayer. The Cr-based interlayer also promotes in-plane C-axis growth of Co, but does not appear to be effective without the underlying seed layer(s) of materials such as MgO or NiAl. Such seed layers may also improve other magnetic properties in the bias layer 75, including enabling reduced grain size and higher coercivity.

Figure 7:
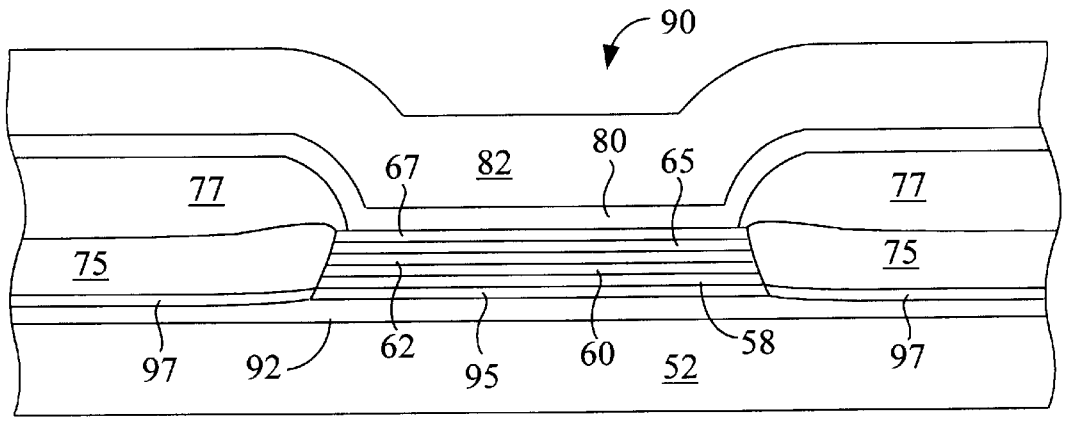
FIG. 7 is a media-facing view of a third embodiment of a transducer of the present invention having improved magnetic bias layers.

FIG. 7 illustrates a sensor 90 much like that shown in FIG. 5, but with a first read gap 92 made of MgO and an alumina seed layer 95 adjoining the sense layer 58. The MgO read gap 92 is formed to a thickness of 200 Å to 800 Å, after which it is polished to provide a smooth surface for the alumina layer 95. Alumina layer 95 is then formed to a thickness of 50 Å to 100 Å, providing a smooth, flat, amorphous surface for the subsequently formed, spin valve layers 58, 60, 62, 65, and 67. After formation of those spin valve layers, a mask is formed to protect an active area and the sensor is trimmed by ion beam etching, which in this embodiment is timed to remove the alumina layer 95 that is not covered by the mask, exposing the MgO layer 92 as a seed for bias layers that will be formed abutting the spin valve layers. Additionally, the ion milling can be monitored for the presence of MgO as an indication that the alumina seed layer 95 has been removed. Atop the freshly exposed MgO an optional interlayer 97 containing a material such as Cr or a Cr based alloy such as CrV or CoCrTa may be formed to a thickness that may range between about 10 Å and 50 Å. Although not shown in this figure, a layer of NiAl may be formed prior to the interlayer 97, much as described above. This is followed by formation of a bias layer 75 of co-based material which has an in-plane easy axis of magnetization. The other layers of this sensor are similar to those described above for FIG. 5 and so for conciseness will not be repeated here.

As mentioned above, the seed layers such as NiAl or MgO have crystalline structures with surfaces promoting the C-axis of subsequently formed Co to align with the plane of the hard bias layers, as opposed to aligning perpendicular to that plane as may otherwise be the tendency of Co. Although individual grains of a bias layer may point in various directions including out of the plane of that layer, the averaging of those grain directions, as represented by the easy axis of magnetization for that layer, may be substantially parallel to the layer. Having an easy axis of magnetization that is in-plane allows the bias layer to be more easily magnetized in a desired direction toward or away from the sensor, so that the bias layer and sensor can both be made thinner for increased resolution and sensitivity.

The seed layers are deposited either by ion beam deposition or radio frequency (RF) or direct current (DC) sputtering of NiAl or other materials. The Co-based bias layers may include other materials that are immiscible in Co, such as Cr or Ta, and that tend toward grain boundaries, increasing the granularity and coercivity of the bias layer. Grains sizes of bias layers formed atop NiAl or MgO are about half that of grains formed conventionally atop a Cr seed, which helps increase coercivity and provides smaller edge domains. Other elements such as Pt may be present in the Co-based bias layers, the elements such as Pt being miscible in Co to the extent that they may fit into or adjacent the Co unit cell shown in FIG. 3, extending the C-axis and increasing the coercivity. The higher coercivity of the magnetic layer affords greater stability while the smaller edge domains provide pinning of corresponding edge domains of the sensor layers while allowing the remainder of the sensor to change magnetic direction in response to signal fields.

For the situation in which MgO or another electrical insulator is used as a seed layer to promote an in-plane easy axis bias layer, care should be taken to ensure that the seed layer does not interfere with electrical conduction between the leads and the sensor. Although the use of MgO as a read gap layer is desirable in order to provide subsequently formed bias layers with an in-plane easy axis of magnetization, conventional MgO formed to a thickness of more than perhaps 100 Å typically develops a rough surface that may be deleterious to any MR sensor layers formed on the read gap. The MgO layers of the present invention, however, are formed by sputter-deposition of MgO under process conditions that can create a relatively smooth surface, including providing an AC bias to the substrate upon which the MgO is formed that tends to promote self-planarization, the substrate bias being less than that provided to the target. After formation of such an MgO layer, the plasma may be employed to further smooth the exposed surface.

Figure 8:
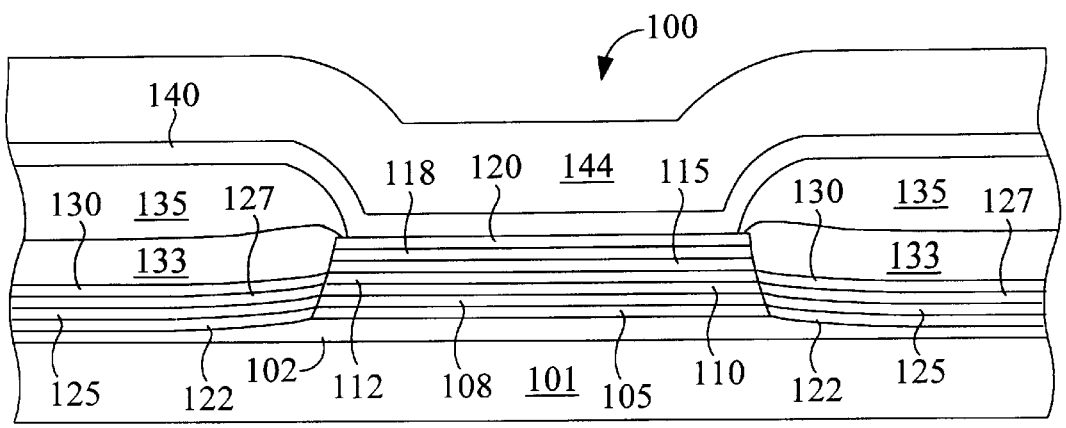
FIG. 8 is a media-facing view of a fourth embodiment of a transducer of the present invention having improved magnetic bias layers.

FIG. 8 illustrates a GMR sensor 100 having several seed layers for improving the magnetic bias. A shield 101 and first read gap layer 102 are formed as is conventional. A pinning structure 105 is disposed on the read gap layer 102, and a pinned layer 108 of permalloy or other known magnetic materials adjoins the pinned layer. An electrically conductive spacer layer 110 that may contain Au, Ti or Cu separates the pinned layer from a sense layer 112 of permalloy or other known ferromagnetic material. A second electrically conductive spacer layer 115 adjoins the sense layer 112, with a second pinned layer 118 separated from the sense layer 112 by the second conductive layer 115. A second pinning structure 120 adjoins the second pinned layer 118.

After masking and directional etching such as ion beam milling that truncates GMR layers 105–120, a first seed layer 122 of NiAl or other crystallographically favorable materials is formed on the exposed portion of the read gap layer 102 to provide a surface with a lattice edge essentially matching that of the C-axis of cobalt. An interlayer 125 of a Cr-based material is then formed, followed by a second seed layer 127 of NiAl or the like, upon which another Cr-based layer 130 is formed. The Cr-based layers 125 and 130 may have a thickness ranging between 10 Å and 30 Å, with the seed layers 122 and 127 having a thickness ranging between approximately equal that of the Cr based layers and several times that of the Cr-based layers. Although only four seed layers 122, 125, 127 and 130 are illustrated here for conciseness, more such layers may be formed, up to a total thickness for the laminated seed layers ranging between about 100 Å and 200 Å.

Atop the laminated seed layers a magnetic bias layer 133 containing cobalt is formed having small grains, high coercivity and a generally in-plane easy axis of magnetization. Lead layers 135 of electrically conductive material are deposited on the bias layers, after which a mask which had protected the GMR layers is lifted off, and a second read gap layer 140 is formed. Another magnetically permeable layer 144 is then formed, shielding the GMR layers from sensing stray bits.

Although we have focused on teaching the preferred embodiments of this invention, other embodiments and modifications will be apparent to persons of ordinary skill in the art in view of these teachings. Therefore, this invention is to be limited only by the following claims, which include all such embodiments and modifications when viewed in conjunction with the above specification and accompanying drawings.

What is claimed is:

1. A transducer for sensing magnetic fields, comprising:
    a magnetoresistive device including a plurality of adjoining, substantially parallel layers terminating at first and second ends,
    a seed layer containing a crystalline material adjoining at least one of said ends and having a surface with a lattice constant substantially matching that of a C-axis of cobalt, and
    a magnetic layer containing cobalt disposed over said seed layer and abutting said ends, said magnetic layer having an easy axis of magnetization that is substantially parallel to said interface.

2. The transducer of claim 1 further comprising an interlayer containing chromium disposed between said seed layer and said magnetic layer.

3. The transducer of claim 1 wherein said seed layer contains NiAl.

4. The transducer of claim 1 wherein said seed layer contains MgO.

5. The transducer of claim 1 wherein said magnetic layer has an in-plane easy axis of magnetization.

6. The transducer of claim 1 further comprising a second seed layer containing a crystalline material with a surface having a lattice constant substantially matching that of a C-axis of cobalt, said second seed layer disposed between said seed layer and said magnetic layer.

7. The transducer of claim 6 wherein said seed layer contains MgO and said second seed layer contains NiAl.

8. A transducer for sensing magnetic signals, comprising:
    a first magnetic layer formed on a substrate,
    a nonmagnetic layer disposed on said first magnetic layer,
    a magnetoresistive mechanism disposed on said nonmagnetic layer and including a second magnetic layer,
    a third magnetic layer disposed on said nonmagnetic layer and having a coercivity substantially higher than that of said first or second magnetic layers, and
    a plurality of seed layers disposed between said nonmagnetic layer and said third magnetic layer, a first of said seed layers consisting essentially of a first material and a second of said seed layers consisting essentially of a second material, wherein said first and second materials are different.

9. The transducer of claim 8 wherein at least one said seed layers contains a material having crystalline structure promoting an in-plane easy axis of magnetization in said third magnetic layer.

10. The transducer of claim 8 wherein at least one of said seed layers contains NiAl.

11. The transducer of claim 8 wherein at least one of said seed layers contains MgO.

12. The transducer of claim 8 wherein one of said seed layers contains NiAl and another of said seed layers contains Cr.

13. The transducer of claim 8 wherein one of said seed layers contains MgO and another of said seed layers contains Cr.

14. The transducer of claim 8 wherein one of said seed layers contains MgO and another of said seed layers contains NiAl.

15. The transducer of claim 8 wherein one of said seed layers contains MgO, another of said seed layers contains NiAl and a third of said seed layers contains Cr.

16. The transducer of claim 8 wherein at least one of said seed layers contains at least one of FeAl and CoTi.

17. The transducer of claim 8 wherein said third magnetic layer contains Co and has an easy axis of magnetization substantially parallel to said interface.

18. A transducer for sensing magnetic signals, comprising:
    a first magnetic layer,
    a nonmagnetic layer disposed on said first magnetic layer,
    a magnetoresistive mechanism disposed on said nonmagnetic layer and including a second magnetic layer,
    a seed layer disposed on said nonmagnetic layer and adjoining said magnetoresistive mechanism, and a third magnetic layer disposed atop said seed layer, said third magnetic layer containing cobalt and having a coercivity substantially higher than that of said first or second magnetic layers, wherein at least one of said nonmagnetic layer and said seed layer contains a material having a crystalline structure promoting formation in said third magnetic layer of an in-plane easy axis of magnetization.

19. The transducer of claim 18 wherein said seed layer contains a plurality of lamina.

20. The transducer of claim 18 wherein said seed layer contains NiAl.

21. The transducer of claim 18 wherein said seed layer contains MgO.

22. The transducer of claim 18 wherein said nonmagnetic layer contains MgO.

23. The transducer of claim 18 further comprising a second seed layer adjoining said seed layer and not adjoining said nonmagnetic layer, wherein said seed layer contains MgO and said second seed layer contains NiAl.

24. The transducer of claim 18 further comprising a second seed layer disposed on said nonmagnetic layer and not disposed on said seed layer, wherein said nonmagnetic layer contains MgO and said second seed layer contains NiAl.

25. The transducer of claim 18 wherein contains Co and has an easy axis of magnetization substantially parallel to said interface.

26. The transducer of claim 18 further comprising:

an interlayer disposed between said nonmagnetic layer and said third magnetic layer, said interlayer containing Cr.

* * * * *